(12) United States Patent
Davis et al.

(10) Patent No.: US 6,973,604 B2
(45) Date of Patent: Dec. 6, 2005

(54) ALLOCATION OF SPARING RESOURCES IN A MAGNETORESISTIVE SOLID-STATE STORAGE DEVICE

(75) Inventors: James Andrew Davis, Richmond, VA (US); Jonathan Jedwab, London (GB)

(73) Assignee: Hewlett-Packard Development Company, L.P., Houston, TX (US)

( * ) Notice: Subject to any disclaimer, the term of this patent is extended or adjusted under 35 U.S.C. 154(b) by 383 days.

(21) Appl. No.: 10/093,833

(22) Filed: Mar. 8, 2002

(65) Prior Publication Data

US 2003/0172329 A1 Sep. 11, 2003

(51) Int. Cl.$^7$ .............................................. G11C 29/00
(52) U.S. Cl. ........................................ 714/710; 714/711
(58) Field of Search ................................ 714/710, 711, 714/718, 719, 723, 724, 758, 759; 365/158, 171, 200

(56) References Cited

U.S. PATENT DOCUMENTS

| | | | |
|---|---|---|---|
| 4,069,970 A | 1/1978 | Buzzard et al. ............. 235/312 |
| 4,209,846 A | 6/1980 | Seppa ......................... 364/900 |
| 4,216,541 A | 8/1980 | Clover et al. | |
| 4,458,349 A | 7/1984 | Aichelmann, Jr. et al. | |
| 4,933,940 A | 6/1990 | Walter et al. | |
| 4,939,694 A | 7/1990 | Eaton et al. ................ 365/200 |
| 5,233,614 A * | 8/1993 | Singh ......................... 714/723 |
| 5,459,742 A | 10/1995 | Cassidy et al. | |
| 5,502,728 A | 3/1996 | Smith, III ............. 395/182.03 |
| 5,504,760 A | 4/1996 | Harari et al. ............. 371/40.1 |
| 5,745,673 A | 4/1998 | Di Zenzo et al. ....... 395/182.05 |
| 5,848,076 A | 12/1998 | Yoshimura ................ 37/40.11 |
| 5,852,574 A | 12/1998 | Naji ........................... 365/158 |
| 5,887,270 A | 3/1999 | Brant et al. ................. 711/162 |
| 5,987,573 A | 11/1999 | Hiraka ....................... 711/156 |
| 6,166,944 A | 12/2000 | Ogino ......................... 365/97 |
| 6,279,133 B1 | 8/2001 | Vafai et al. ................ 714/763 |
| 6,408,401 B1 * | 6/2002 | Bhavsar et al. .............. 714/7 |
| 6,430,702 B1 | 8/2002 | Santeler et al. ............... 714/6 |
| 6,456,525 B1 | 9/2002 | Perner et al. ............... 365/171 |
| 2003/0023911 A1 | 1/2003 | Davis et al. ................. 714/723 |
| 2003/0023922 A1 | 1/2003 | Davis et al. ................. 714/763 |
| 2003/0023923 A1 | 1/2003 | Davis et al. ................. 714/763 |
| 2003/0023924 A1 | 1/2003 | Davis et al. ................. 714/763 |
| 2003/0023925 A1 | 1/2003 | Davis et al. ................. 714/763 |
| 2003/0023926 A1 | 1/2003 | Davis et al. ................. 714/763 |
| 2003/0023927 A1 | 1/2003 | Jedwab et al. .............. 714/763 |
| 2003/0023928 A1 | 1/2003 | Jedwab et al. .............. 714/763 |
| 2003/0172339 A1 | 9/2003 | Davis et al. ................. 714/763 |

FOREIGN PATENT DOCUMENTS

| | | |
|---|---|---|
| EP | 0 494 547 A2 | 7/1992 |
| EP | 0 918 334 A2 | 5/1999 |
| EP | 1 132 924 A2 | 9/2001 |

OTHER PUBLICATIONS

Abstract of Japanese Patent No. JP 60007698, published Jan. 16, 1985, esp@cenet.com.

Peterson, W.W. and E.J. Weldon, Jr., *Error–Correcting Codes*, Second Edition, MIT Press, Ch. 1–3, 8 and 9 (1984).

*Reed–Solomon Codes and Their Applications*, S.B. Wicker and V.K. Bhargava, ed., IEEE Press, New York, Ch. 1, 2, 4 and 12 (1994).

* cited by examiner

*Primary Examiner*—Guy J. Lamarre
*Assistant Examiner*—James C. Kerveros (57) ABSTRACT

A magnetoresistive state-solid state storage device having arrays of magnetoresistive storage cells. Sparing resources such as a plurality of spare rows are allocated to replace rows of storage cells which are affected by physical failures. A count is made for the number of failed rows within each array, and a count is also made of the number of failed rows within a cross-array row set spread across plural arrays. A spare row or rows are allocated by selecting a cross-array row set affected by the highest number of failed rows and therefore most likely to lead to unreliable data storage, and then selecting an array in this cross-array row set having the lowest number of failed rows, and therefore the least competition for sparing resources. The method proceeds iteratively with counts updated as sparing resources are allocated.

23 Claims, 6 Drawing Sheets

| row set | round A | B | C | D | E | F |
|---|---|---|---|---|---|---|
| r1 | 1 | 1 | 1 | 1 | 1 | 1 |
| r2 | 5 | 4 | 3 | 2 | 1 | 1 |
| r3 | 2 | 2 | 2 | 2 | 2 | 1 |
| r4 | 0 | 0 | 0 | 0 | 0 | 0 |

| array | round A | B | C | D | E | F |
|---|---|---|---|---|---|---|
| 101 | 0 | 0 | 0 | 0 | 0 | 0 |
| 102 | 1 | 0 | 0 | 0 | 0 | 0 |
| 103 | 3 | 3 | 3 | 3 | 3 | 2 |
| 104 | 0 | 0 | 0 | 0 | 0 | 0 |
| 105 | 2 | 2 | 2 | 2 | 1 | 1 |
| 106 | 1 | 1 | 0 | 0 | 0 | 0 |
| 107 | 1 | 1 | 1 | 0 | 0 | 0 |
| 108 | 0 | 0 | 0 | 0 | 0 | 0 |

ALLOCATION OF SPARING RESOURCES IN A MAGNETORESISTIVE SOLID-STATE STORAGE DEVICE

CROSS REFERENCE TO RELATED APPLICATION

This application is related to the pending U.S. patent application Ser. No. 09/440,323 filed on Nov. 15, 1999.

The present invention relates in general to a method for allocating sparing resources in a magnetoresistive solid-state storage device, and more particularly, but not exclusively, to a method for allocating spare rows of storage cells to replace rows affected by physical failures.

A typical solid-state storage device comprises one or more arrays of storage cells for storing data. Existing semiconductor technologies provide volatile solid-state storage devices suitable for relatively short term storage of data, such as dynamic random access memory (DRAM), or devices for relatively longer term storage of data such as static random access memory (SRAM) or non-volatile flash and EEPROM devices. However, many other technologies are known or are being developed.

Recently, a magnetoresistive storage device has been developed as a new type of non-volatile solid-state storage device (see, for example, EP-A-0918334 Hewlett-Packard). The magnetoresistive solid-state storage device is also known as a magnetic random access memory (MRAM) device. MRAM devices have relatively low power consumption and relatively fast access times, particularly for data write operations, which renders MRAM devices ideally suitable for both short term and long term storage applications.

Like most solid-state storage devices, MRAM devices are subject to physical failure, which can result in an unacceptable loss of stored data. In particular, currently available manufacturing techniques for MRAM devices are subject to limitations and as a result manufacturing yields of acceptable MRAM devices are relatively low. Although better manufacturing techniques are being developed, these tend to increase manufacturing complexity and cost. Hence, it is desired to apply lower cost manufacturing techniques whilst increasing device yield. In many forms of solid-state storage devices it is known to provide additional spare storage capacity, which is employed to replace portions of the device affected by physical failure. However, sparing is costly and only a limited sparing capacity can be provided. A problem arises particularly when the available sparing capacity is not sufficient to replace all portions of the device affected by physical failure. That is, at manufacture many MRAM devices are severely affected by physical failures, and a relatively large sparing capacity is required in order to achieve commercially acceptable manufacturing device yield.

An aim of the present invention is to provide a method for allocating sparing resources in a MRAM device, where a limited sparing capacity is used efficiently. A preferred aim is to improve storage capacity of a device, by allocating available sparing capacity. In particular it is desired to minimise portions of the device which, after allocation of available sparing capacity, remain severely affected by physical failures.

According to a first aspect of the present invention there is provided a method for allocating sparing resources in a magnetoresistive solid-state storage device having magnetoresistive storage cells arranged in a plurality of arrays, comprising the steps of: identifying cells or groups of cells amongst the magnetoresistive storage cells that are affected by physical failures; forming a first count representing sparing resources in each of the plurality of arrays required to reduce the effects of the identified physical failures; defining a plurality of cross-array sets, each cross-array set comprising a portion from each of a subset of the plurality of arrays, and forming a second count representing an effect of physical failures for each of the plurality of cross-array sets; determining a cross-array set that is worst affected by failures, with reference to the second count; determining an array of that cross-array set that is least affected by failures, with reference to the first count; and allocating a sparing resource in the determined array, with respect to the determined cross-array set.

Preferably, the magnetoresistive storage cells are arranged in rows. Here, the identifying step comprises identifying a row of storage cells containing at least one storage cell affected by a physical failure. Preferably, the identifying step comprises identifying a row of storage cells affected by a grouped-type failure.

Preferably, the first count for each array represents the number of rows that require replacement with a spare row. Preferably, each cross-array set comprises one or more rows from each of the subset of the plurality of arrays, and the second count represents a number of rows within the cross-array set affected by physical failures. Here, the second count represents a number of rows of storage cells affected by one or more grouped-type physical failures. Preferably, storage cells in each cross-array set together in use are arranged to store one or more logical units of data.

Preferably, in the identifying step the physical failures are identified by examining the storage cells with a parametric evaluation and/or by a write-read-compare operation.

Preferably, the method includes recording the first count and the second count in a sparing allocation table. Here, the method preferably comprises updating the first count and the second count recorded in the sparing allocation table, after allocation of a sparing resource.

Preferably, the method comprises selecting active cross-array sets and active arrays amongst which it is desired to allocate an available sparing resource. Preferably, the selecting step excludes any array having no need for a sparing resource, or for which all of the available sparing resources have been allocated, and excludes a cross-array set when all of the contributing arrays to that cross-array set are excluded. The method suitably continues until no further active arrays and active cross-array row sets can be selected.

The method preferably includes the additional step of pre-allocating sparing resources, in the arrays where there is no competition for those sparing resources.

The method preferably includes the further step of testing the MRAM device to confirm that, with the storage cells arranged into sets according to a determined data storage layout, each set of storage cells is suitable for storing ECC encoded data.

According to a second aspect of the present invention there is provided a method for allocating sparing resources in a magnetoresistive solid-state storage device having magnetoresistive storage cells arranged in rows in a plurality of arrays, comprising the steps of: counting a number of failed rows within each array, and counting a number of failed rows within each of a plurality of cross-array row sets comprising one or more rows from each of a subset of the plurality of arrays; selecting a cross-array row set having a highest number of failed rows; and allocating a spare row or rows in an array within the selected cross-array row set having a lowest number of failed rows.

The method preferably comprises updating the counts and repeating the selecting and allocating steps until available sparing resources have been allocated.

The method also preferably comprises determining failed rows by determining storage cells or groups of storage cells which are affected by physical failures. Here, the method preferably comprises performing a parametric examination, and/or a logical write-read-compare operation, to identify storage cells or groups of storage cells affected by physical failures.

According to a third aspect of the present invention there is provided a method for allocating sparing resources in a magnetoresistive solid-state storage device, comprising the steps of: providing magnetoresistive storage cells arranged in rows in a plurality of arrays, each array having one or more spare rows capable of replacing a row of that array; determining storage cells or groups of storage cells affected by physical failures; for each of the plurality of arrays, counting a number of failed rows in that array, where each failed row requires replacement by a spare row; allocating spare rows in each array, where the number of failed rows is less than or equal to the number of available spare rows; counting a number of failed rows containing cells affected by physical failures in a plurality of cross-array row sets each comprising one or more rows in more than one array; selecting active arrays and active cross-array row sets, amongst which it is desired to allocate an available spare row; selecting a cross-array row set most affected by physical failures, with reference to the count for each active cross-array row set; amongst the arrays contributing rows to the selected cross-array row set, selecting an array having least competition for the spare row, with reference to the count for each array; and allocating a spare row in the selected array to replace a row contributing to the selected cross-array row set.

According to a fourth aspect of the present invention there is provided a method for allocating sparing resources in a magnetoresistive solid-state storage device having magnetoresistive storage cells arranged in a plurality of arrays, comprising the steps of: allocating available sparing resources within each of the plurality of arrays; testing the plurality of arrays to identify sets of the storage cells which are not suitable for storing error correction encoded data according to a predetermined error correction coding scheme and a predetermined data storage layout; and making redundant the identified not suitable sets of cells.

According to a fifth aspect of the present invention there is provided a magnetoresistive solid-state storage device, comprising: a plurality of magnetoresistive storage cells arranged in rows in a plurality of arrays, each array having access to one or more spare rows for replacing a row of storage cells in that array; a plurality of cross-array row sets comprising one or more rows from each of a subset of the plurality of arrays; a test unit arranged to identify storage cells or groups of storage cells affected by physical failures; a counting unit arranged to count a number of failed rows within each array, and to count a number of failed rows within each cross-array row set; a selecting unit arranged to select one cross-array row set having a highest number of failed rows, and arranged to select one array contributing rows to that cross-array row set having a lowest number of failed rows; and a sparing allocation unit arranged to allocate a spare row or rows to replace a row or rows of cells of the selected cross-array row set in the selected array.

The invention also extends to an apparatus including the magnetoresistive solid-state storage device defined herein.

For a better understanding of the invention, and to show how embodiments of the same may be carried into effect, reference will now be made, by way of example, to the accompanying diagrammatic drawings in which.

To assist a complete understanding of the present invention, an example MRAM device will first be described with reference to FIGS. 1 and 2, including a description of the failure mechanisms found in MRAM devices. A much simplified example device will then be described with reference to FIGS. 3 to 5, to illustrate the preferred sparing method shown in FIG. 6.

Figure 1:
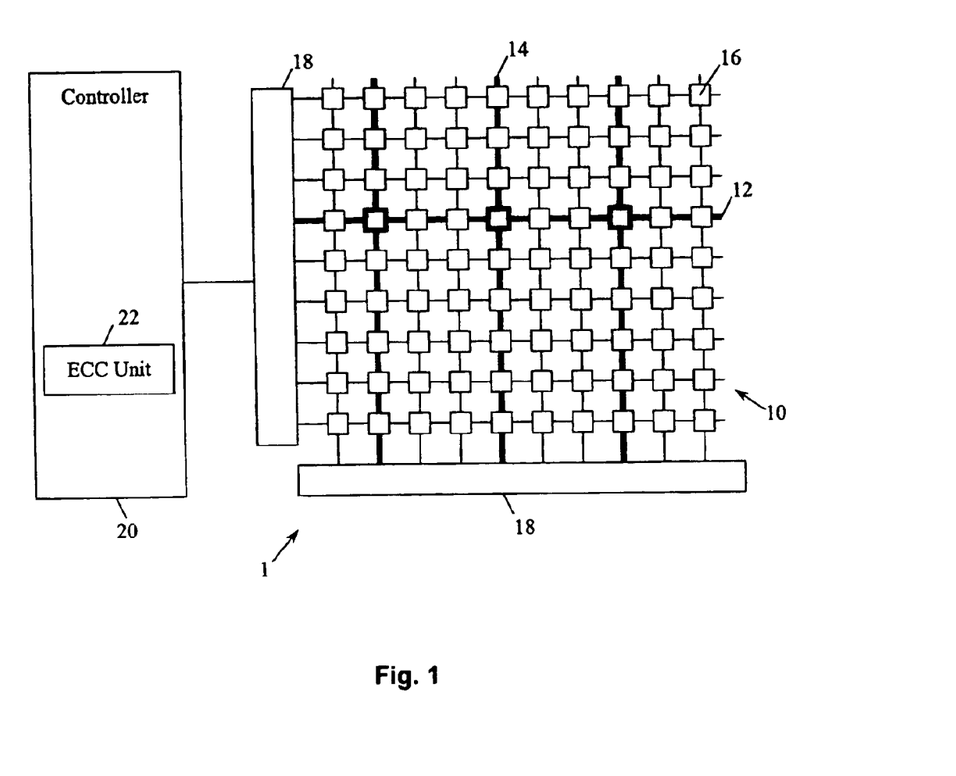
FIG. 1 is a schematic diagram showing a preferred MRAM device including an array of storage cells.

FIG. 1 shows a magnetoresistive solid-state storage device 1 comprising an array 10 of storage cells 16. The array 10 is coupled to a controller 20 which, amongst other control elements, includes an ECC coding and decoding unit 22. The controller 20 and the array 10 can be formed on a single substrate, or can be arranged separately. EP-A-0 918 334 (Hewlett-Packard) discloses one example of a magnetoresistive solid-state storage device which is suitable for use in preferred embodiments of the present invention.

In the preferred embodiment, the array 10 comprises of the order of 1024 by 1024 storage cells, just a few of which are illustrated. The storage cells 16 are each formed at an intersection between control lines 12 and 14. In this example control lines 12 are arranged in rows, and control lines 14 are arranged in columns. The control lines 12 and 14 are generally orthogonal, but other more complicated lattice structures are also possible. Suitably, the row and column lines 12,14 are coupled to control circuits 18, which include a plurality of read/write control circuits. Depending upon the implementation, one read/write control circuit is provided per column, or read/write control circuits are multiplexed or shared between columns.

In a device access such as a write operation or a read operation, one row 12 and one or more columns 14 are selected by the control circuits 18 to access the required storage cell or cells 16 (or conversely one column and several rows, depending upon the orientation of the array). The selected cells 16, the selected row line 12, and the selected column lines 14, are each represented by bold lines in FIG. 1. The preferred MRAM device requires a minimum distance m, such as sixty-four cells, between the selected column lines 14 to minimise cross-cell interference. Given that each array 10 has rows of length l, such as 1024 storage cells, it is possible to access substantially simultaneously up to $1/m=1024/64=16$ cells from the array 10.

Each storage cell 16 stores one bit of data suitably representing a numerical value and preferably a binary value, i.e. one or zero. Suitably, each storage cell includes two films which assume one of two stable magnetisation orientations, known as parallel and anti-parallel. The magnetisation orientation affects the resistance of the storage cell. When the storage cell 16 is in the anti-parallel state, the resistance is at its highest, and when the magnetic storage cell is in the parallel state, the resistance is at its lowest. Suitably, the high resistance anti-parallel state defines a "0" logic state, and the low resistance parallel state defines a "1" logic state, or vice versa. In the preferred device, the resistance of each storage cell 16 is determined according to a phenomenon known as spin tunnelling and the cells are referred to as magnetic tunnel junction storage cells. The condition of the storage cell is determined by measuring the sense current (proportional to resistance) or a related parameter such as response time to discharge a known capacitance, which gives one or more parametric values for each storage cell. A logical value can then be derived from the obtained parametric value or values. Depending upon the nature and construction of the MRAM device, the read operation may comprise multiple steps or require combined read and rewrite actions.

Figure 2:
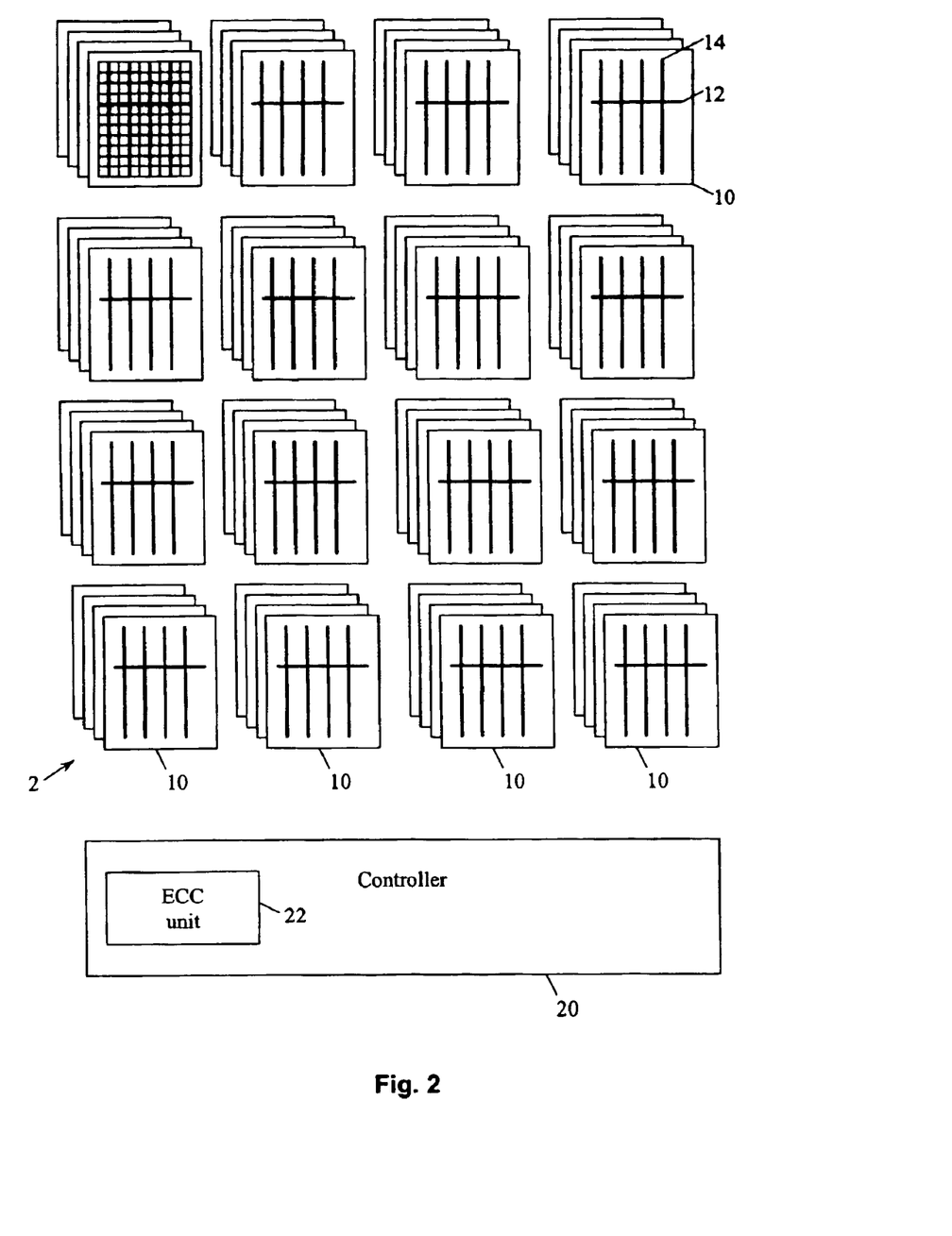
FIG. 2 shows a preferred MRAM device in more detail.

FIG. 2 shows the preferred MRAM device in more detail. A macro-array 2 is formed comprising a large plurality of individual arrays 10, each of which is formed as discussed above for FIG. 1. The use of plural arrays advantageously allows an MRAM device to be obtained of a desired overall data storage capacity, without the individual arrays 10 in themselves becoming so large that they are difficult to manufacture or control. For simplicity, FIG. 2 shows only a portion of the macro-array.

Many design choices are available to the skilled person when laying out the arrays 10 on a suitable substrate during manufacture of the device, but, amongst other concerns, it is commonly desired to reduce substrate area for each device. Conveniently, it has been found that the arrays 10 can be manufactured in layers. In the example of FIG. 2, four arrays 10 are layered to form a stack. In an example practical device having a storage capacity of the order of 128 Mbytes, 1024 arrays are arranged in a macro-array of 16 arrays wide, by 16 arrays high, with four stack layers. In another preferred device, ECC encoded data is stored in 1280 arrays arranged 16 wide by 20 high with 4 stack layers, giving a total capacity of 160 Mbytes. Optionally, the MRAM device comprises more than one such macro-array.

As illustrated in FIG. 2, the preferred method for accessing the MRAM device 1 comprises selecting one row 12 in each of a plurality of arrays 10, and selecting plural columns 14 from each of the plurality of arrays to thereby select a plurality of storage cells 16. The accessed cells within each of the plurality of arrays correspond to a small portion of a unit of data. Together, the accessed cells provide a whole unit of data, such as a whole sector unit, or at least a substantial portion of the unit. Advantageously, each of the plurality of arrays are accessible substantially simultaneously. Therefore, device access speed for a read operation or a write operation is increased. This device access is conveniently termed a slice through the macro-array.

As shown in FIG. 2, it is convenient for the same row address and the same column addresses to be selected in each of the plurality of arrays. That is, a unit of data is stored across a plurality of arrays, using the same row and column addresses within each of the plurality of arrays.

As also shown in FIG. 2, in the preferred construction the arrays 10 are layered to form stacks. Only one array within each stack can be accessed at any one time. Therefore, it is convenient that the plurality of arrays used to store a sector unit of data are each in different stacks (i.e. none of the selected plurality of arrays are in the same stack). Also, it is convenient to select arrays which are all in the same layer. Ideally, one array is selected from each stack, the arrays each being in the same layer within each stack. In the example of FIG. 2, the topmost array within each stack has been selected.

Most conveniently, the number of arrays available in the macro-array 2 is matched to the size of a sector unit of data to be stored in the device. Here, it is convenient to provide the total number of arrays such that, given the number of cells which can be substantially simultaneously accessed in an array, a sector unit is stored using cells within all of the arrays of a single layer of the device, to store a whole sector unit of data. In other preferred embodiments, it is convenient for a reciprocal integer fraction of a sector unit of data (e.g. one half or one third or one quarter of a sector unit) to be accessible substantially simultaneously.

Although generally reliable, it has been found that failures can occur which affect the ability of the device to store data reliably in the storage cells 16. Physical failures within a MRAM device can result from many causes including manufacturing imperfections, internal effects such as noise in a read process, environmental effects such as temperature and surrounding electro-magnetic noise, or ageing of the device in use. In general, failures can be classified as either systematic failures or random failures. Systematic failures consistently affect a particular storage cell or a particular group of storage cells. Random failures occur transiently and are not consistently repeatable. Typically, systematic failures arise as a result of manufacturing imperfections and ageing, whilst random failures occur in response to internal effects and to external environmental effects.

Failures are highly undesirable and mean that at least some storage cells in the device cannot be written to or read from reliably. A cell affected by a failure can become unreadable, in which case no logical value can be read from the cell, or can become unreliable, in which case the logical value read from the cell is not necessarily the same as the value written to the cell (e.g. a "1" is written but a "0" is read). The storage capacity and reliability of the device can be severely affected and in the worst case the entire device becomes unusable.

Failure mechanisms take many forms, and the following examples are amongst those identified:

1. Shorted bits—where the resistance of the storage cell is much lower than expected. Shorted bits tend to affect all storage cells lying in the same row and the same column.
2. Open bits—where the resistance of the storage cell is much higher than expected. Open bit failures can, but do not always, affect all storage cells lying in the same row or column, or both.
3. Half-select bits—where writing to a storage cell in a particular row or column causes another storage cell in the same row or column to change state. A cell which is vulnerable to half select will therefore possibly change state in response to a write access to any storage cell in the same row or column, resulting in unreliable stored data.
4. Single failed bits—where a particular storage cell fails (e.g. is stuck always as a "0"), but does not affect other storage cells and is not affected by activity in other storage cells.

These four example failure mechanisms are each systematic, in that the same storage cell or cells are consistently affected. Where the failure mechanism affects only one cell, this can be termed an isolated failure. Where the failure mechanism affects a group of cells, this can be termed a grouped failure.

Whilst the storage cells of the MRAM device can be used to store data according to any suitable logical layout, data is preferably organised into basic sub-units (e.g. bytes) which in turn are grouped into larger logical data units (e.g. sectors). A physical failure, and in particular a grouped failure affecting many cells, can affect many bytes and possibly many sectors. It has been found that keeping information about each small logical sub-unit (e.g. bytes) affected by physical failures is not efficient, due to the quantity of data involved. That is, attempts to produce a list of all such logical units rendered unusable due to at least one physical failure, tend to generate a quantity of management data which is too large to handle efficiently. Further, depending on how the data is organised on the device, a single physical failure can potentially affect a large number of logical data units, such that avoiding use of all bytes, sectors or other units affected by a failure substantially reduces the storage capacity of the device. For example, a grouped failure such as a shorted bit failure in just one storage cell affects many other storage cells, which lie in the same row or the same column. Thus, a single shorted bit failure can affect 1023 other cells lying in the same row, and 1023 cells lying in the same column—a total of 2027 affected cells. These 2027 affected cells may form part of many bytes, and many sectors, each of which would be rendered unusable by the single grouped failure. Hence, the failure mechanisms of the example MRAM devices are quite unlike those encountered in other solid-state storage devices.

Some improvements have been made in manufacturing processes and device construction to reduce the number of manufacturing failures and improve device longevity, but this usually involves increased manufacturing costs and complexity, and reduced device yields. One example technique is the use of sparing. A row identified as containing failures is made redundant (spared) and replaced by one of a set of unused additional spare rows, and similarly for columns. However, either a physical replacement is required (i.e. routing connections from the failed row or column to instead reach the spare row or column), or else additional control overhead is required to map logical addresses to physical row and column lines. In the preferred embodiments, a spare row is simpler to construct than a spare column. Only a limited sparing capacity can be provided, since enlarging the device to include spare rows and columns reduces device density for a fixed area of substrate and increases manufacturing complexity. Therefore, the preferred embodiments of the invention aim to allocate available sparing resources with the most beneficial results. In particular, it is desired to efficiently allocate available sparing resources such that available storage capacity of the device is increased.

Figure 3:
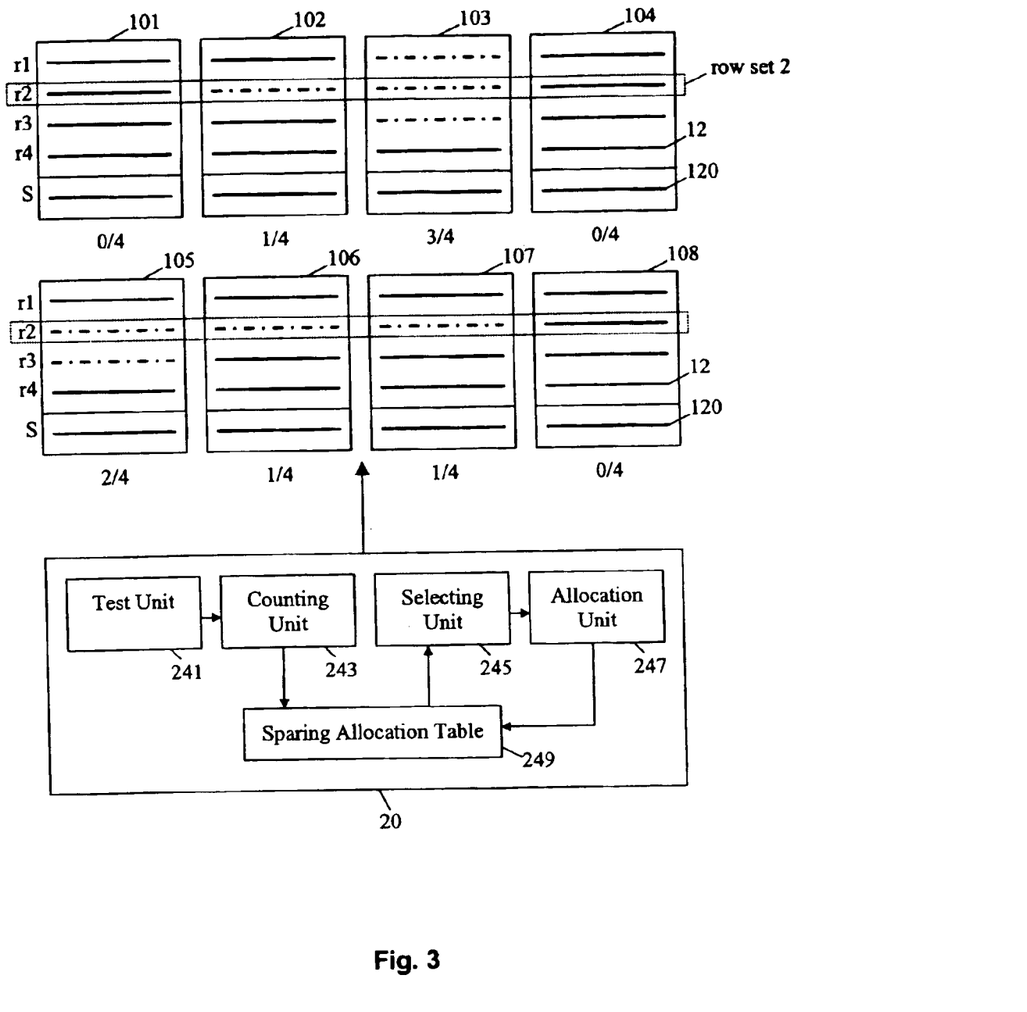
FIG. 3 shows a simplified MRAM device to illustrate allocation of spare rows.

FIG. 3 shows a simplified MRAM device. The controller 20 is arranged to allocate available sparing resources in the device, and includes a test unit 241, a counting unit 243, a selecting unit 245, a sparing allocation unit 247, and a sparing allocation table 249.

The MRAM device of FIG. 3 has been greatly simplified for ease of explanation, and comprises eight arrays 101–108 each generally similar to the arrays 10 discussed with reference to FIGS. 1 and 2. In this simplified example, each array 101–108 comprises just four rows r1–r4 together with one spare row 120. Some of these rows are considered to be failed rows affected by some form of physical failure, and are represented by a dashed line, whilst the other rows are represented with a solid line. Each array has been marked with a total showing, out of the four available rows, the number of rows which are considered to be failed rows, e.g. "0/4" or "1/4".

It will be seen that the array 102 contains only one failed row, and so the allocation of the spare row 120 in that array is straightforward and does not require a choice. However, array 103 contains three failed rows, and it is not immediately apparent which of those three rows should be replaced by the available spare row 120 in order to achieve the greatest benefit. The same situation applies to array 105 which contains two failed rows but only one spare row.

A cross-array row set comprises a set of one (or more) rows from each of the arrays 101–108. As described above with reference to FIG. 2, the arrays 101–108 are suitably arranged to be accessed in a slice by selecting cells in one row and one or more columns from each array. In FIG. 3, the cross-array row set comprising the second row r2 of each array has been highlighted. Likewise, three other cross-array row sets each comprise respectively rows r1, r3 and r4 from each array 101–108.

Figure 4:
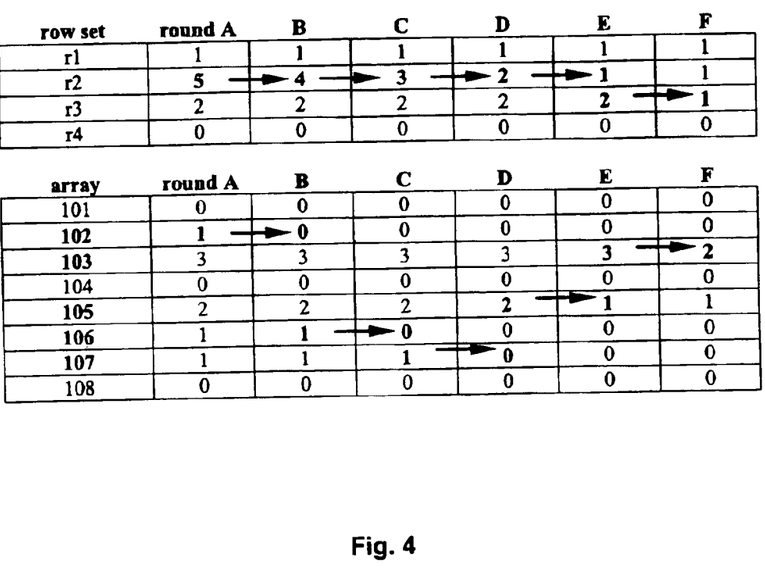
FIG. 4 is a table illustrating a preferred order of allocation.

FIG. 4 shows example content of the sparing allocation table 249 with a count representing the effect of failures on each cross-array row set, and a count representing the effect of failures within each array. The starting position represented by FIG. 3 is shown as column "A". The sparing allocation table 249 is suitably populated with counts formed by the counting unit 243 in response to an evaluation of the device undertaken by the test unit 241.

Figure 5:
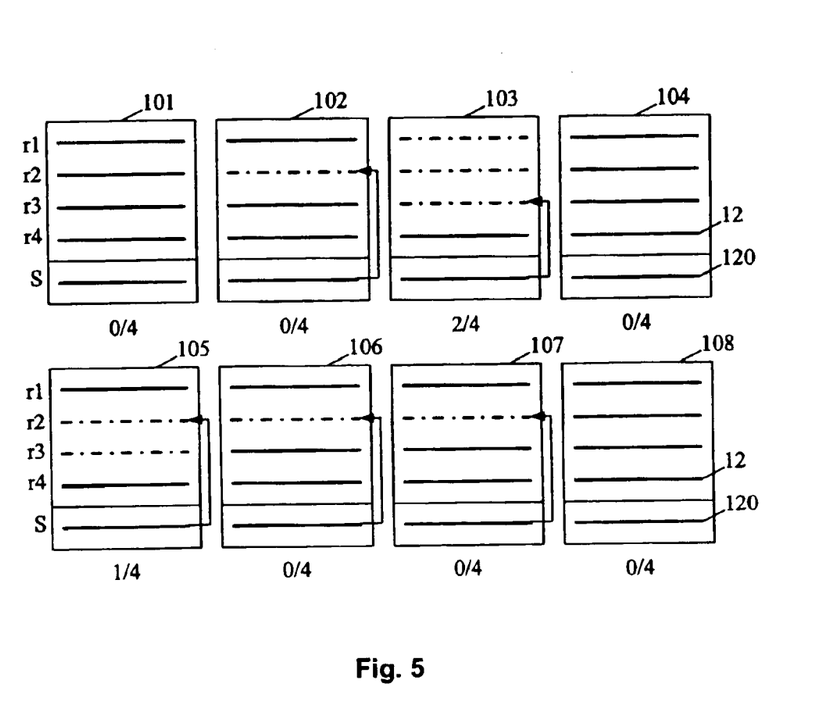
FIG. 5 shows the simplified MRAM device with spare rows allocated.

FIG. 5 shows the same simplified MRAM device of FIG. 3, but with the available spare row in each array allocated to replace a selected one of the four rows in that array, i.e. representing the position at column "F" of FIG. 4. The sparing resources are allocated by the allocation unit 247, in response to selections made by the selecting unit 245 with reference to the sparing allocation table 249. The sparing allocation table 249 is then updated to reflect the effects of allocating those sparing resources.

Figure 6:
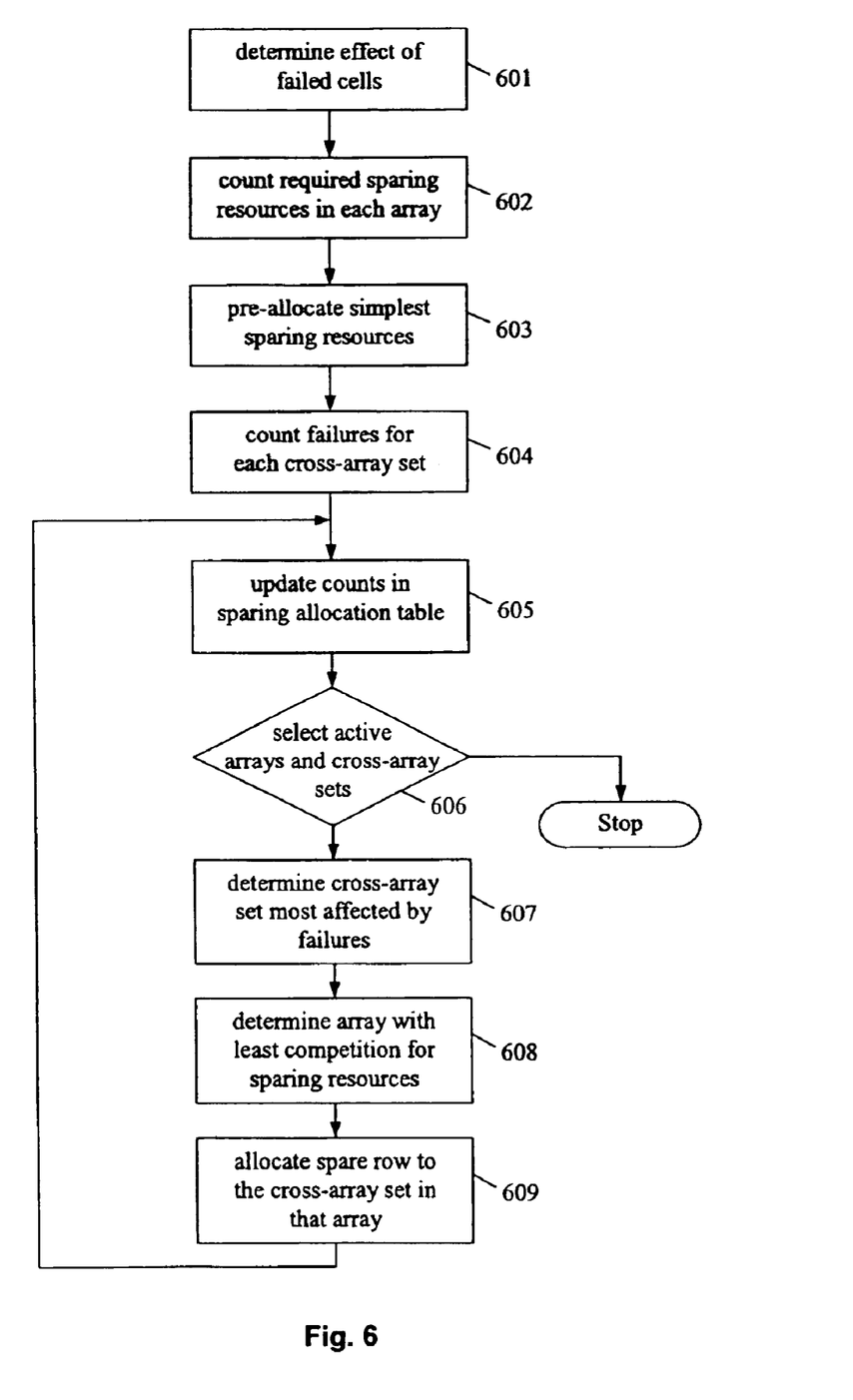
FIG. 6 shows a preferred method for allocating sparing resources.

FIG. 6 shows a preferred method for allocating sparing resources in an MRAM device having a plurality of arrays. The method is applicable to the simplified MRAM device shown in FIGS. 3 to 5, and is also applicable to MRAM devices of a practical scale.

Step 601 comprises determining the effect of failures in each of a plurality of arrays, using the test unit 241. The method can be applied to a whole macro-array in one operation, or applied to a subset of the available arrays. The physical failures can be determined by any suitable operation. In one example embodiment the storage cells 16 are subject to a parametric evaluation. Here, one or more parametric values are obtained from each cell, and compared against a range or ranges to identify those cells affected by physical failures. In another example embodiment a write-read-compare operation is performed with test data to identify cells affected by failures. In the preferred embodiment, it is particularly desired to identify rows of storage cells affected by a grouped failure such as a shorted-bit or an open-bit failure. Other forms of failure having a lesser impact are ignored, such as isolated bit failures (e.g. half-select bits) and single-bit failures.

Step 602 comprises forming a count of the sparing resources required in each of the plurality of arrays. In the simplest example this step involves providing an individual count for each array, of the number of rows that require replacement with a spare row. In a practical embodiment, the count is determined in relation to the physical constraints of a particular device. As one example, where arrays are arranged in stacks, the physical sparing mechanism may require that if a given row is spared then the same row position in each of the other arrays of the same stack must also be spared. Another possible physical constraint is that rows are spared in groups of two or four from each array.

Step 603 optionally comprises pre-allocating sparing resources, in the arrays where there is no competition for those sparing resources. That is, the available spare rows are allocated first in arrays where allocation is straightforward and no choice need be made. Where the number of failed rows in an array is less than or equal to the number of available spare rows, then the failed rows in that array are replaced using the available spare rows. The method then proceeds as shown in FIG. 6, in order to allocate sparing resources in the arrays where a choice is required.

Step 604 comprises forming a count representing the effect of failures within each cross-array row set. In the simplified example of FIGS. 3 to 5, the cross-array row set is one row from each of the plurality of arrays and the count represents the number of failed rows in the cross-array row set. However, in practical embodiments of the invention the cross-array row set may take a variety of different forms and each cross-array row set comprises any suitable portion from any suitable number of arrays. In particular, the cross-array row set is determined based on the manner in which logical data units are organised on the MRAM device, for which there are many possible options. For example, the cross-array row set may comprise a plurality of rows (e.g. two or three complete rows) from each of a plurality of arrays. Further, the cross-array row set may take only a part of one or more rows from each array, such as a group of cells from each physical row. In one preferred practical example, a cross-array row set comprises two physical rows from each of about 128 arrays, selected from amongst of the order of 1024 arrays forming a macro-array 2 of the MRAM device 1. Conveniently, this cross-array row set together in use will store one or more logical units of data, such as one or more sector units (e.g. 512 bytes). If a physical failure affects any cells either in the first physical row or the second physical row, then a failure is counted in the relevant cross-array row set. That is, both sets of cells must be perfect in order for that group of cells to be excluded from the count for that cross-array row set.

It is preferred to determine the position of the logical data units in a fixed manner (i.e. such that the layout is the same for all devices regardless of the position of failures in a particular device). The sparing resources are then allocated in order to improve available storage capacity for that fixed data storage layout.

At step 605, the examination and counting of steps 601, 602 and 604 allows the sparing allocation table 249 to be produced, with data for the starting position of column "A" in FIG. 4. In this illustrative example, the pre-allocation of step 603 has not been performed.

Step 606 comprises selecting active rows and active arrays amongst which it is desired to allocate available sparing resources, which can be done by the selecting unit 245. Here, any array for which no sparing resources are available is not selected (i.e. an array having no need for spare rows, or for which all of the available spare rows have been allocated). A cross-array row set is excluded from consideration when all of the contributing arrays to that cross-array row set are excluded. The active cross-array row sets and active arrays are conveniently determined with reference to the sparing allocation table.

Step 607 comprises determining the active cross-array row set that has been worst affected by failures, i.e. having the highest number of failures in the count determined in step 604. Looking at FIG. 4, in column "A" cross-array row set r2 has the greatest number of failures, in this case caused by the five failed rows in arrays 102, 103, 105, 106 & 107.

Step 608 comprises determining the active array that is least affected by failures, i.e. having the lowest number of failed rows, and which contributes to the selected row set. Looking at FIG. 4, in column "A" it will be seen that arrays 102, 106 and 107 each have the lowest number, in this case one. A selection is then made between these joint lowest arrays, such as taking the first array in the list, in this case array 102.

Step 609 comprises allocating a sparing resource in the array selected in step 608, with respect to the row or rows contained in the cross-array row set selected in step 607. This can be done by the allocation unit 247. Hence, row r2 in array 102 is replaced with the spare row 120, as shown in FIGS. 4 and 5.

The method now goes back to step 605 to update the sparing allocation table 249 as a result of the row or rows spared in step 609. Looking at FIG. 4, the one failed row in array 102 has been spared, giving now zero failed rows in array 102, and reducing the number of failed rows affecting the cross-array row set r2 from five to four, as shown in column B. The method continues until all of the available sparing resources have been allocated, at which point no further active arrays and active cross-array row sets can be selected.

Advantageously, the method works iteratively through the cross-array row sets starting with the cross-array row set having the highest failure count, i.e. starting with a cross-array row set which is more likely to lead to logical units of data that must be discarded. From this cross-array row set, an array is chosen having the lowest number of failed rows, i.e. an array for which it is less likely that there will be future competition for available sparing resources. Hence, the method aims to avoid making choices in respect of those arrays for which there is competition for the available sparing resources. The worst affected arrays having the greatest number of failed rows are left until later in the method, at which point allocation decisions become easier because sparing resources have already been allocated in the lesser-affected arrays.

Looking at the simplified example of FIGS. 3 to 5, by applying the method it has been determined that of the three failed rows in array 103, it is row r3 that should be spared. Also, of the two failed rows in array 105, it has been determined that row r2 should be spared, in order to give a beneficial overall effect. The outcome of the preferred method can be contrasted with other example outcomes, such as where the row r1 is spared in the array 103, in which case a row set total of two failed rows remains in row set r3, whichever row is spared in array 105.

Referring to FIG. 4, at the end of the method in column "F", it can be seen that cross-array row sets r1, r2 and r3 are each now affected by only one failed row. If necessary, remedial action can then be taken, such as discarding logical units of data which will, in use, employ the storage cells in those failed rows, or re-organising the logical units to avoid those failed rows. However, the preferred embodiments of the present invention employ error correction coding to provide a magnetoresistive solid-state storage device which is error tolerant, preferably to tolerate and recover from both random failures and systematic failures.

Typically, error correction coding involves receiving original information which it is desired to store and forming encoded data which allows errors to be identified and ideally corrected. The encoded data is stored in the solid-state storage device. At read time, the original information is recovered by error correction decoding the encoded stored data. A wide range of error correction coding (ECC) schemes are available and can be employed alone or in combination. Suitable ECC schemes include both schemes with single-bit symbols (e.g. BCH) and schemes with multiple-bit symbols (e.g. Reed-Solomon). In the current MRAM devices, grouped failures tend to affect a large group of storage cells, sharing the same row or column. This provides an environment which is unlike prior storage devices. The preferred embodiments of the present invention employ an ECC scheme with multi-bit symbols. Where manufacturing processes and device design change over time, it may become more appropriate to organise storage locations expecting bit-based errors and then apply an ECC scheme using single-bit symbols.

As general background information concerning error correction coding, reference is made to the following publication: W. W. Peterson and E. J. Weldon, Jr., "Error-Correcting Codes", $2^{nd}$ edition, $12^{th}$ printing, 1994, MIT Press, Cambridge Mass.

A more specific reference concerning Reed-Solomon codes used in the preferred embodiments of the present invention is: "Reed-Solomon Codes and their Applications", ED. S. B. Wicker and V. K. Bhargava, IEEE Press, New York, 1994.

The preferred ECC scheme in use employs erasure information which marks potentially unreliable symbols of a block of ECC encoded data. The use of erasure information allows improved decoding of the ECC encoded data.

The method of FIG. 6 preferably concludes with the step of testing the MRAM device to confirm that, with the storage cells 16 arranged into sets according to a determined data storage layout, each set of storage cells is suitable for storing ECC encoded data. That is, the test confirms the device can successfully store ECC encoded data, now that the sparing resources have been allocated.

The preferred test uses a combination of a parametric test and a write-read-compare logical test. The parametric test is ideally suited for identifying failed storage cells where the failures will be visible in use for the generation of erasure information used in ECC decoding, such as shorted-bit and open-bit failures. Here, the parametric test comprises comparing parametric values obtained from the storage cells against one or more failure ranges. By contrast, the write-read-compare logical test is performed with test data and is ideally suited to identifying failed storage cells which will be hidden for the generation of erasure information in use, such as half-select bits and single failed bits. A failure count is formed based on both the visible failures and the hidden failures, to determine whether that set of storage cells is suitable for storing ECC encoded data. Here, the failure count is weighted, with hidden failures having a greater weighting than visible failures. Where a set of storage cells is determined as unsuitable, remedial action is taken to avoid future use of those cells.

Ideally, each unit of data (e.g. a codeword or ECC encoded sector) is stored with a few sub-units (e.g. bytes or symbols) in each of a large plurality of the arrays 10. Therefore, a failure (e.g. a failed row) in any one array affects only a small portion of the data unit. Here, data storage layouts are employed to minimise the effect of those failures on the stored ECC encoded data. The preferred data storage layouts include storing all bits of each symbol in storage cells 16 in one row 12, or in at least two rows 12 but using storage cells 16 in the same columns 14. In other embodiments, sets of bits taken from each row 12 are allocated to different codewords and the order of allocation can be rotated. A second level of error checking can be applied by adding a parity bit to each symbol.

The MRAM device described herein is ideally suited for use in place of any prior solid-state storage device. In particular, the MRAM device is ideally suited both for use as a short-term storage device (e.g. cache memory) or a longer-term storage device (e.g. a solid-state hard disk). An MRAM device can be employed for both short term storage and longer term storage within a single apparatus, such as a computing platform.

A magnetoresistive solid-state storage device and a method for allocating sparing resources in such a device have been described. The preferred embodiments of the present invention avoid large scale discarding of logical blocks and make efficient use of physical sparing. Advantageously, the storage device is able to tolerate a relatively large number of errors, particularly grouped failures, while still being put into successful operation with no loss of original data. The preferred embodiments use error correction coding and decoding, which allows blocks of data, e.g. sectors or codewords, to remain in use, where otherwise the whole block must be discarded if only one failure occurs. Together, the efficient allocation of sparing resources and the use of ECC allow simpler and lower cost manufacturing techniques to be employed and/or device yield and device density to be increased.

What is claimed is:

1. A method for allocating sparing resources in a magnetoresistive solid-state storage device having magnetoresistive storage cells arranged in a plurality of arrays, comprising the steps of:

identifying cells or groups of cells amongst the magnetoresistive storage cells that are affected by physical failures;

forming a first count representing sparing resources in each of the plurality of arrays required to reduce the effects of the identified physical failures;

defining a plurality of cross-array sets, each cross-array set comprising a portion from each of a subset of the plurality of arrays, and forming a second count representing an effect of physical failures for each of the plurality of cross-array sets;

determining a cross-array set that is worst affected by failures, with reference to the second count;

determining an array of that cross-array set that is least affected by failures, with reference to the first count; and allocating a sparing resource in the determined array, with respect to the determined cross-array set.

2. The method of claim 1, wherein the magnetoresistive storage cells are arranged in rows.

3. The method of claim 2, wherein the identifying step comprises identifying a row of storage cells containing at least one storage cell affected by a physical failure.

4. The method of claim 3, wherein the identifying step comprises identifying a row of storage cells affected by a grouped-type failure.

5. The method of claim 2, wherein the first count for each array represents the number of rows that require replacement with a spare row.

6. The method of claim 2, wherein each cross-array set comprises one or more rows from each of the subset of the plurality of arrays, and the second count represents a number of rows within the cross-array set affected by physical failures.

7. The method of claim 6, wherein the second count represents a number of rows of storage cells affected by one or more grouped-type physical failures.

8. The method of claim 6, wherein storage cells in each cross-array set together in use are arranged to store one or more logical units of data.

9. The method of claim 1, wherein in the identifying step the physical failures are identified by examining the storage cells with a parametric evaluation and/or by a write-read-compare operation.

10. The method of claim 1, comprising recording the first count and the second count in a sparing allocation table.

11. The method of claim 10, comprising updating the first count and the second count recorded in the sparing allocation table, after allocation of a sparing resource.

12. The method of claim 1, comprising selecting active cross-array sets and active arrays amongst which it is desired to allocate an available sparing resource.

13. The method of claim 12, wherein the selecting step excludes any array having no need for a sparing resource, or for which all of the available sparing resources have been allocated, and excludes a cross-array set when all of the contributing arrays to that cross-array set are excluded.

14. The method of claim 13, wherein the method continues until no further active arrays and active cross-array row sets can be selected.

15. The method of claim 1, comprising pre-allocating sparing resources, in the arrays where there is no competition for those sparing resources.

16. The method of claim 1, comprising testing the MRAM device to confirm that, with the storage cells arranged into sets according to a determined data storage layout, each set of storage cells is suitable for storing ECC encoded data.

17. A method for allocating sparing resources in a magnetoresistive solid-state storage device having magnetoresistive storage cells arranged in rows in a plurality of arrays, comprising the steps of:
  counting a number of failed rows within each array, and counting a number of failed rows within each of a plurality of cross-array row sets comprising one or more rows from each of a subset of the plurality of arrays;
  selecting a cross-array row set having a highest number of failed rows; and
  allocating a spare row or rows in an array within the selected cross-array row set having a lowest number of failed rows.

18. The method of claim 17, comprising updating the counts and repeating the selecting and allocating steps until available sparing resources have been allocated.

19. The method of claim 17, comprising determining failed rows by determining storage cells or groups of storage cells which are affected by physical failures.

20. The method of claim 19, comprising performing a parametric examination, and/or a logical write-read-compare operation, to identify storage cells or groups of storage cells affected by physical failures.

21. A method for allocating sparing resources in a magnetoresistive solid-state storage device, comprising the steps of:
  providing magnetoresistive storage cells arranged in rows in a plurality of arrays, each array having one or more spare rows capable of replacing a row of that array;
  determining storage cells or groups of storage cells affected by physical failures;
  for each of the plurality of arrays, counting a number of failed rows in that array, where each failed row requires replacement by a spare row;
  allocating spare rows in each array, where the number of failed rows is less than or equal to the number of available spare rows;
  counting a number of failed rows containing cells affected by physical failures in a plurality of cross-array row sets each comprising one or more rows in more than one array;
  selecting active arrays and active cross-array row sets, amongst which it is desired to allocate an available spare row;
  selecting a cross-array row set most affected by physical failures, with reference to the count for each active cross-array row set;
  amongst the arrays contributing rows to the selected cross-array row set, selecting an array having least competition for the spare row, with reference to the count for each array; and
  allocating a spare row in the selected array to replace a row contributing to the selected cross-array row set.

22. A magnetoresistive solid-state storage device, comprising:
  a plurality of magnetoresistive storage cells arranged in rows in a plurality of arrays, each array having access to one or more spare rows for replacing a row of storage cells in that array;
  a plurality of cross-array row sets comprising one or more rows from each of a subset of the plurality of arrays;
  a test unit arranged to identify storage cells or groups of storage cells affected by physical failures;
  a counting unit arranged to count a number of railed rows within each array, and to count a number of failed rows within each cross-array row set;
  a selecting unit arranged to select one cross-array row set having a highest number of failed rows, and arranged to select one array contributing rows to that cross-array row set having a lowest number of failed rows; and
  a sparing allocation unit arranged to allocate a spare row or rows to replace a row or rows of cells of the selected cross-array row set in the selected array.

23. An apparatus including the magnetoresistive solid-state storage device of claim 22.

* * * * *